United States Patent
Rossman

(10) Patent No.: US 9,113,568 B2
(45) Date of Patent: Aug. 18, 2015

(54) CABLED BACKPLANE SYSTEM HAVING AN ELECTROMAGNETIC RADIATION ABSORBER

(71) Applicant: Tyco Electronics Corporation, Berwyn, PA (US)

(72) Inventor: Jared Evan Rossman, Dover, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 103 days.

(21) Appl. No.: 14/068,897

(22) Filed: Oct. 31, 2013

(65) Prior Publication Data

US 2015/0114708 A1  Apr. 30, 2015

(51) Int. Cl.
*H01R 13/648* (2006.01)
*H05K 7/14* (2006.01)

(52) U.S. Cl.
CPC ............ *H05K 7/1451* (2013.01); *H01R 13/648* (2013.01)

(58) Field of Classification Search
CPC ............................ H05K 7/1451; H01R 13/648
USPC .......................................................... 174/359
See application file for complete search history.

(56) References Cited

U.S. PATENT DOCUMENTS

| | | | | |
|---|---|---|---|---|
| 3,562,402 | A | * | 2/1971 | Dwyer .......................... 174/373 |
| 3,654,379 | A | * | 4/1972 | Rodgers ........................ 174/372 |
| 4,748,540 | A | * | 5/1988 | Henneberg et al. ...... 361/679.46 |
| 5,670,743 | A | * | 9/1997 | Welch et al. ................... 174/377 |
| 6,185,098 | B1 | * | 2/2001 | Benavides ..................... 361/695 |
| 8,277,252 | B2 | | 10/2012 | Fogg et al. |
| 2003/0024718 | A1 | * | 2/2003 | Rubenstein et al. ......... 174/35 R |
| 2006/0223371 | A1 | * | 10/2006 | Van Der Mee et al. ....... 439/610 |
| 2011/0250790 | A1 | * | 10/2011 | De Blieck et al. ....... 439/607.01 |

\* cited by examiner

*Primary Examiner* — Hung V Ngo

(57) ABSTRACT

A cable backplane system includes a tray having a frame with side walls surrounding a raceway. The side walls extend to a front edge of the frame. The tray includes spacers coupled to the tray located proximate to the front edge. Cable connectors are held by corresponding spacers in position relative to the backplane. The cable backplane system includes an electromagnetic radiation (EMR) absorber extending along an opening in the tray to suppress the propagation of EMR into or out of the tray.

20 Claims, 7 Drawing Sheets

CABLED BACKPLANE SYSTEM HAVING AN ELECTROMAGNETIC RADIATION ABSORBER

BACKGROUND

The subject matter herein relates generally to communication systems that utilize cable connectors.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and as the requirements for high speed lines become more complex, achieving a baseline level of signal integrity can be challenging. At least some systems have replaced the traditional backplanes with cabled backplane systems. In cabled backplane systems, cable connectors of a tray directly engage mating connectors of line cards and switch cards. A number of cable connectors may be mounted to a single tray, and a number of such trays may be inserted into and secured within a chassis of the backplane system. The trays may be positioned to engage, for example, daughtercard assemblies that include the mating connectors.

It is also desirable to increase the operating frequency of the network system, such as by increasing data transmission rates. Electrical connector systems that operate with data transmission rates above 10 Gbps (Gigabits/second) are often vulnerable to electromagnetic interference (EMI). In conventional designs, EMI is reduced or suppressed by surrounding the chassis with a metal cage. However, in order to perform maintenance on an individual tray, all of the trays in the chassis have to be powered down. An individual tray is not "hot swappable" during system operation. A need exists to replace an individual tray during system operation without interrupting power to all of the trays in the chassis.

BRIEF DESCRIPTION

In an embodiment a cable backplane system is disclosed. The cable backplane system includes a tray having a frame with side walls surrounding a raceway. The side walls extend to a front edge of the frame. The tray includes spacers coupled to the tray located proximate to the front edge. The cable backplane system includes cable connectors held by corresponding spacers. The cable backplane system includes cable connectors having a plurality of cables extending therefrom and routed in the raceway. The cable connectors are held in position relative to the backplane by the spacers. The cable backplane system includes an electromagnetic radiation (EMR) absorber extending along an opening in the tray to suppress the propagation of electromagnetic radiation into or out of the tray.

In an embodiment a cable backplane system is disclosed. The cable backplane system has a backplane having a plurality of backplane openings therethrough. The backplane has mounting areas surrounding corresponding openings. The cable backplane system includes a cable rack coupled to a rear of the backplane. The cable rack comprises a tray having a frame with side walls surrounding a cavity defining a raceway. The side walls extend from a front edge of the frame. The cable rack also includes spacers coupled to the tray proximate to the front edge. The cable connectors have cables extending therefrom and routed in the raceway. The cable connectors are received in corresponding backplane openings and held in position relative to the backplane by the spacers. The cable rack also includes an electromagnetic radiation (EMR) absorber extending along the front edge of the frame. The EMR absorber engages corresponding mounting areas of the backplane. The EMR absorber suppresses the propagation of electromagnetic radiation into or out of the tray.

In an embodiment, a cable backplane system is disclosed. The cable backplane system comprises a tray having a frame with side walls surrounding a cavity defining a raceway. The side walls extend to a front edge of the frame. The tray includes a bottom having an opening provided along the bottom of the tray. The tray also includes a top having an opening provided along the top of the tray. The cable backplane system also includes spacers coupled to the tray proximate to the front edge. The cable backplane system also includes cable connectors having a plurality of cables extending therefrom and routed in the raceway. The cable connectors are held in position relative to the backplane by the spacers. The cable backplane system also includes electromagnetic radiation absorbers extending along at least one of the top opening and the bottom opening in the tray to suppress the propagation of electromagnetic radiation into or out of the tray.

DETAILED DESCRIPTION

Figure 1:
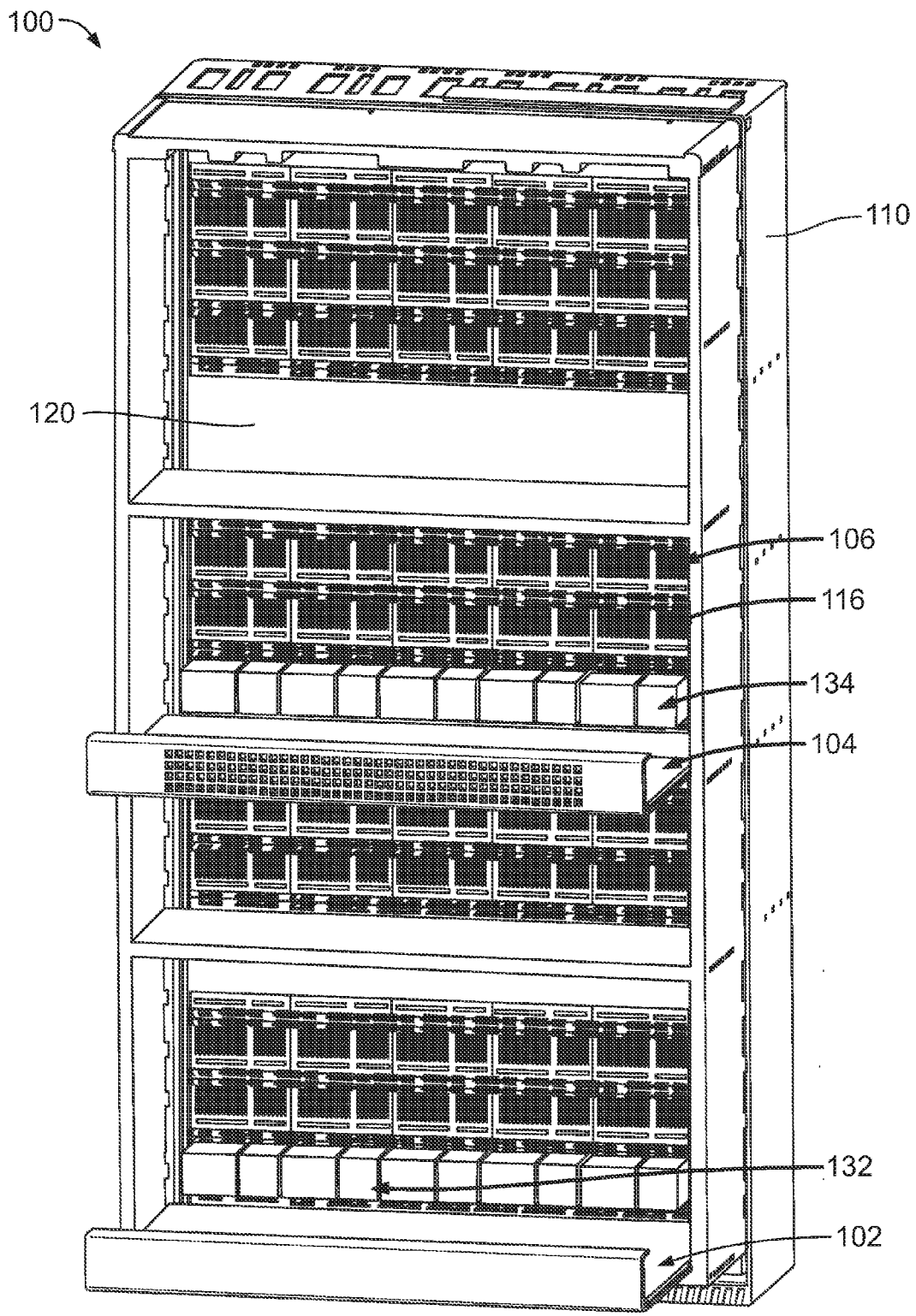
FIG. 1 is a front perspective view of a cable backplane system formed in accordance with an exemplary embodiment.
Figure 2:
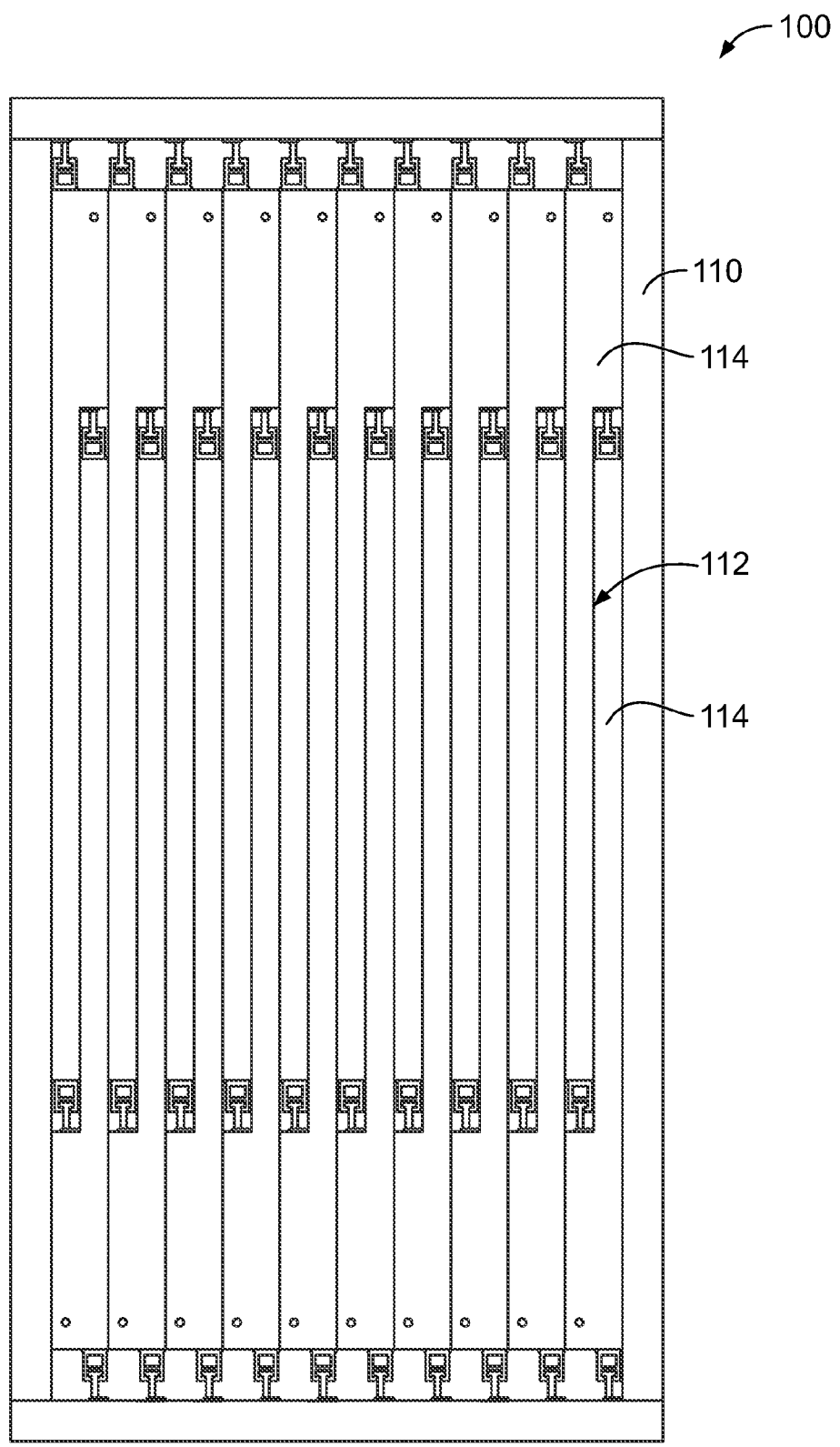
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the line cards 102 and switch cards 104 coupled to the cable backplane system 100.

The cable backplane system 100 includes a cable rack 112 (shown in FIG. 2) that supports and/or manages the cables of the cable connector assemblies 106. The cable rack 112 includes a plurality of trays 114 (shown in FIG. 2) that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 is coupled to and supported by the chassis 110. The trays 114 and cable connectors 116 are coupled to the backplane 120. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces or circuits of the backplane 120. The cable connectors 116 are not electrically connected to the backplane 120, as is typical of conventional backplanes, but rather the cable connectors 116 are interconnected by cables extending between the cable connectors 116. The backplane 120 may be manufactured from other materials in alternative embodiments, such as another dielectric material or a metal material, such as a metal sheet, such as when no electrical routing on the backplane 120 is required.

Figure 3:
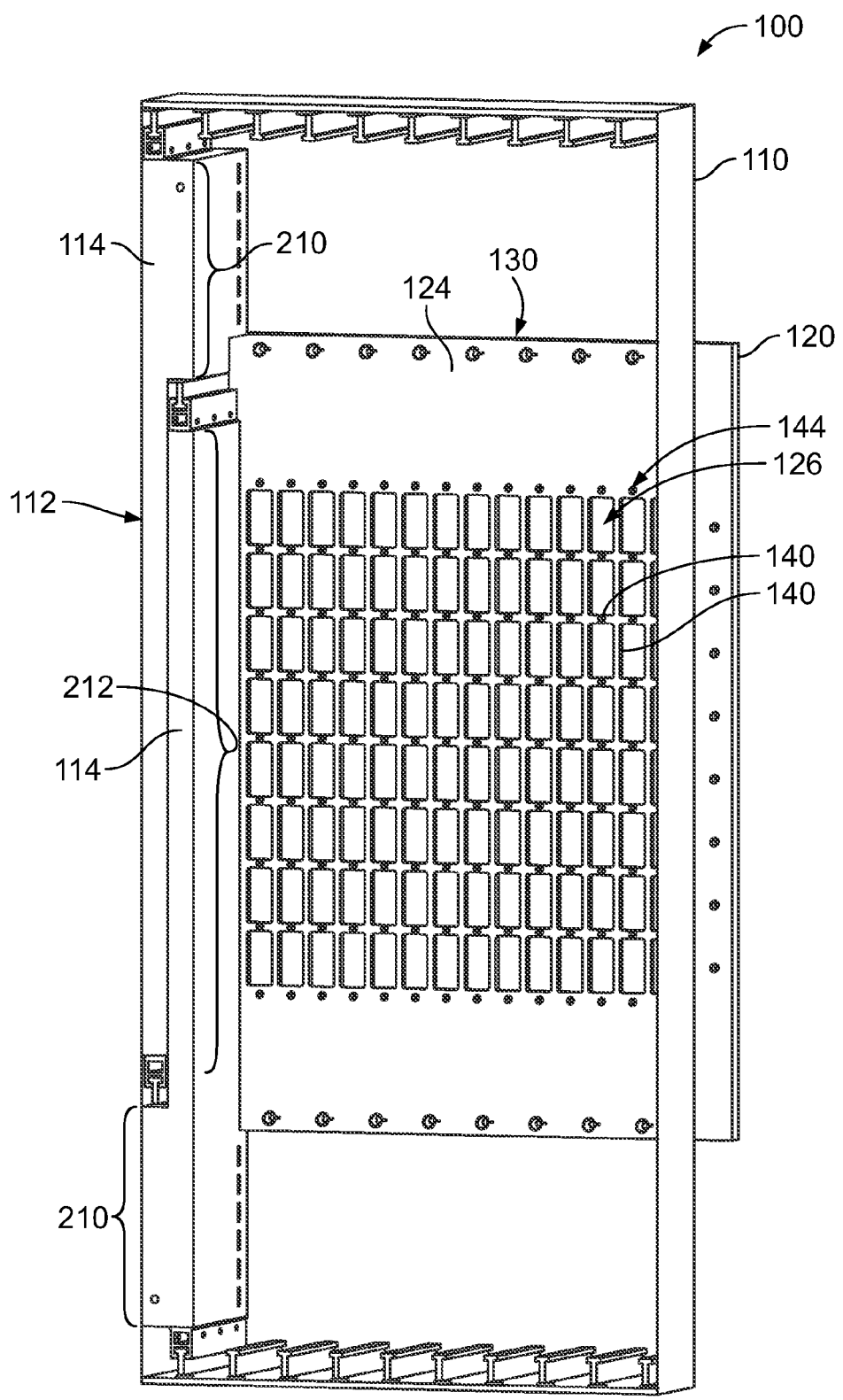
FIG. 3 illustrates a portion of the cable backplane system.

FIG. 3 illustrates the cable backplane system 100 with many of the trays 114 removed for clarity, only showing a couple of the trays 114 mounted to the chassis 110 and backplane 120. The backplane 120 and cable rack 112, with the cable connector assemblies 106 (shown in FIG. 1), are coupled together to form the cable backplane system 100. The cable rack 112 is provided along a rear 124 of the backplane 120. The cable connectors 116 (shown in FIG. 1) extend through openings 126 in the backplane 120 and are presented at a front 130 of the backplane 120 for mating with the line and switch cards 102, 104 (both shown in FIG. 1). In an exemplary embodiment, the cable connectors 116 are held in precise locations for mating with the line cards 102 and/or switch cards 104. The cable rack 112 includes features that align and position the cable connectors 116 with respect to the backplane 120 and that secure the trays 114 to the backplane 120. In an exemplary embodiment, because of the high density of the trays 114 and the limited access to the trays 114, the features used to secure the trays 114 to the backplane are accessible at a rear of the cable rack 112 where such features are more easily accessible.

In an exemplary embodiment, the cable rack 112 is flexible to allow the cable connectors 116 to align with and pass through the openings 126. Optionally, portions of the trays 114 and/or the cable connectors 116 may pass through the openings 126. The trays 114 may float relative to each other and with respect to the backplane 120 to properly align the cable connectors 116 with the corresponding openings 126. Once the trays 114 are coupled to the backplane 120, the backplane 120 may be used to hold the cable connectors 116 in precise locations for mating with the line and switch cards 102, 104. For example, the openings 126 may be used to control the final position of the cable connectors 116 for mating. In an exemplary embodiment, the cable connectors 116 float relative to one another and relative to the trays 114 to allow precise positioning of the cable connectors 116 relative to the backplane 120 for mating with the line and switch cards 102, 104. The line and switch cards 102, 104 have card connectors 132, 134 (both shown in FIG. 1), respectively, that mate with corresponding cable connectors 116. The cable connectors 116 need to be precisely positioned relative to the backplane 120 for mating with corresponding card connectors 132, 134.

A plurality of the openings 126 are visible in FIG. 3. Each opening is sized and shaped to receive a single cable connector 116 (shown in FIG. 1) therein; however the openings 126 may be sized to receive multiple cable connectors 116 therein in alternative embodiments.

The backplane 120 includes crossbars 140 between adjacent openings 126. The crossbars 140 provide support for the backplane 120. The crossbars 140 define mounting locations of the backplane 120 for securing the cable connector assemblies 106 and/or the cable rack 112 to the backplane 120. Optionally, the crossbars 140 may provide a mounting location for mounting blocks 142 (shown in FIG. 9), which may be metal blocks that extend across the front of the backplane 120 to stiffen the backplane 120. The trays 114 may have features that interact with the mounting blocks 142 to secure the trays 114 to the backplane 120. In an exemplary embodiment, the backplane 120 includes guide holes 144 through the crossbars 140 that are used for guidance or alignment of the cable connector assemblies 106 and/or the cable rack 112 during assembly. The guide holes 144 receive guide features, fasteners or other components used to assemble the cable backplane system 100. The guide features may be part of the trays 114 that extend through the backplane 120. The guide features may be part of the mounting blocks 142 coupled to the backplane 120.

Figure 4:
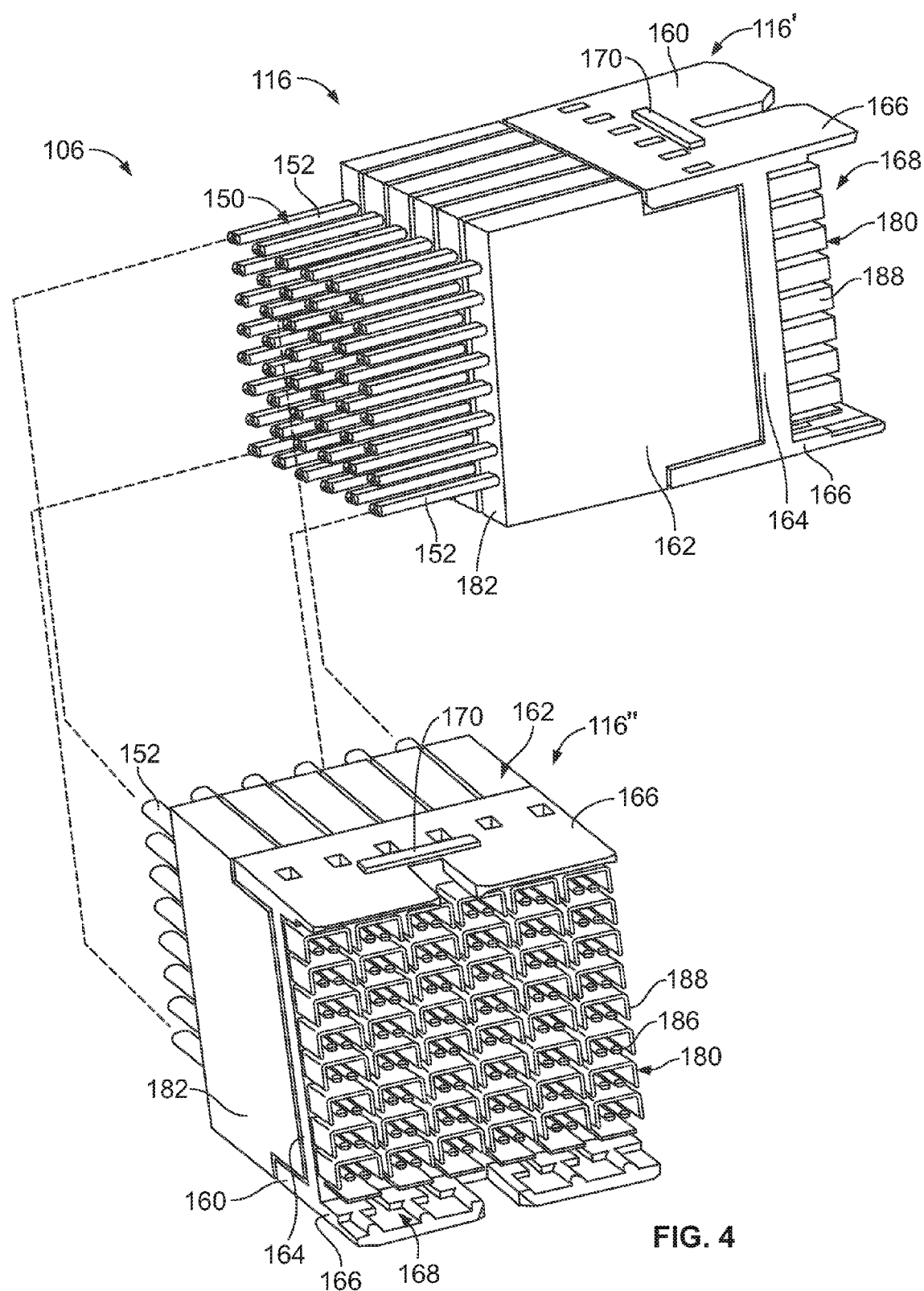
FIG. 4 illustrates a cable connector for the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from radiation.

The support body 182 provides support for the cable assemblies 180. The cables 152 extend into the support body 182 such that the support body 182 supports a portion of the cables 152. The support body 182 may provide stress and/or strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield to electrically common each ground shield 188 and a dielectric overmold overmolded around the cables 152 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in parallel columns. Any number of contact modules 162 may be held by the header housing 160 depending on the particular application. When the contact modules 162 are stacked in the header housing 160, the cable assemblies 180 may also be aligned in rows.

Figure 5:
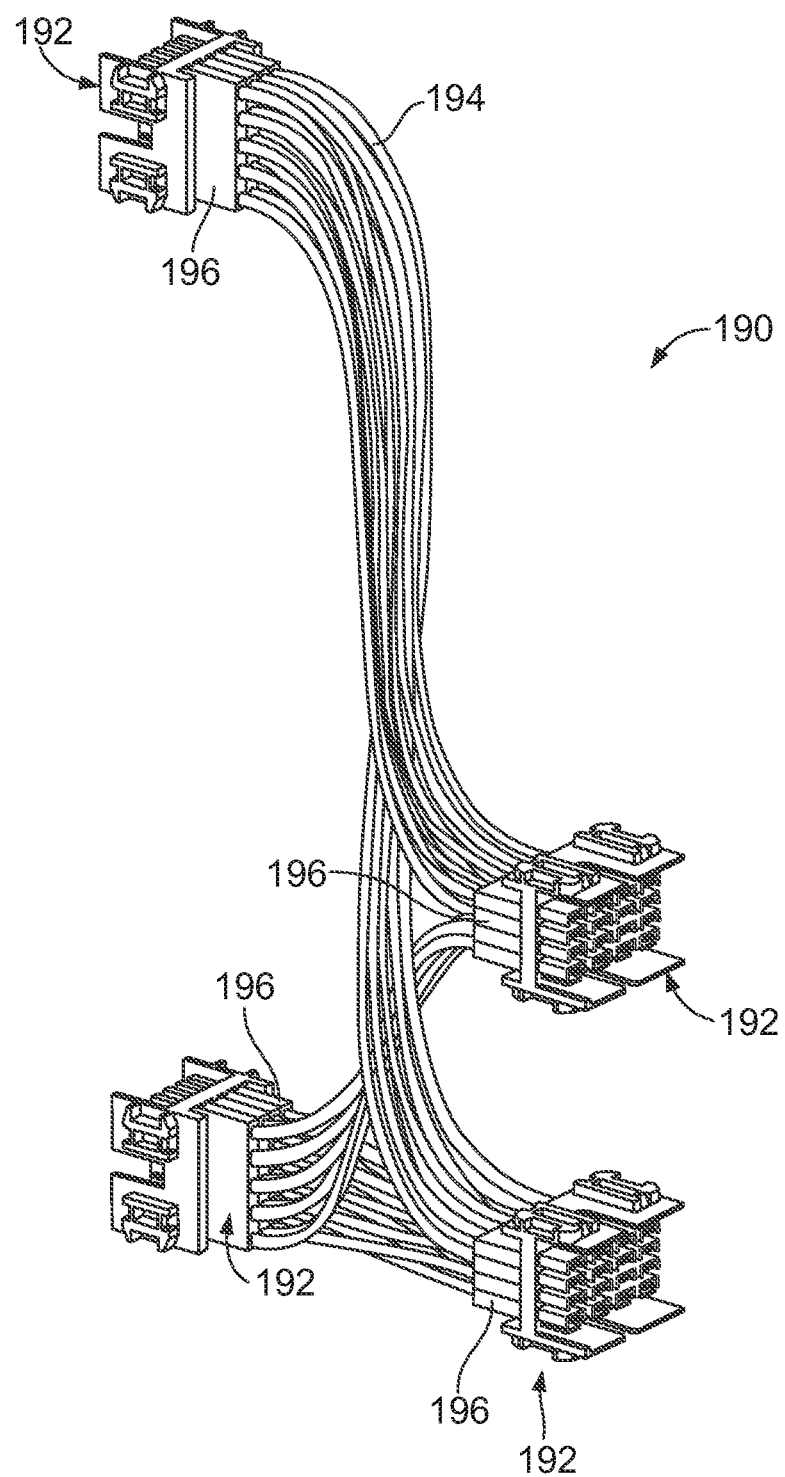
FIG. 5 illustrates a cable connector for the cable backplane system and formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (for example, four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
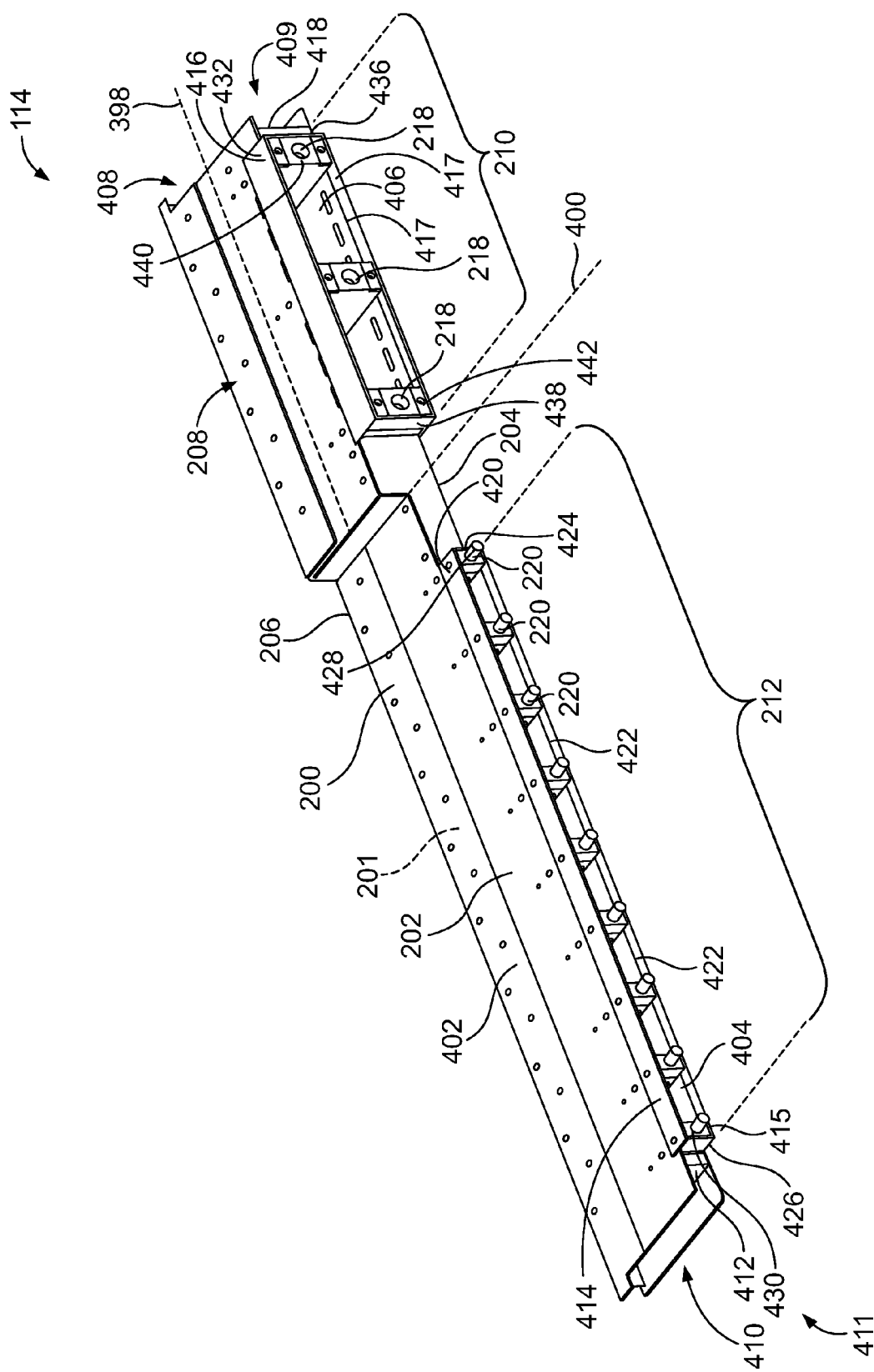
FIG. 6 is a front perspective view of a tray in accordance with an exemplary embodiment.

FIG. 6 is a front perspective view of one of the trays 114 formed in accordance with an exemplary embodiment. The tray 114 includes a frame 200 surrounding a cavity 201 defining a raceway through which the cables 152 (shown in FIG. 4) are routed. The frame 200 includes side walls 202 extending between a front edge 204 and a back side 206 of the frame 200. The side walls 202 surround the cavity 201. A back wall 208 covers the cavity 201 at the back side 206. The frame 200 includes front openings 404 and 406 along the front edge 204. The front openings 404 and 406 are positioned between the side walls 202. The front openings 404 and 406 receive the cable connectors 116 (shown in FIG. 1) therein. The frame 200 includes a top opening 408 and a bottom opening 410 situated between the side walls 202. The top opening 408 is provided along a top 409 of the tray 114. The bottom opening 410 is provided at a bottom 411 of the tray 114. In other embodiments, the top opening 408 and the bottom opening 410 may be closed by walls of the frame 200.

In an exemplary embodiment, the side walls 202 and the back wall 208 are one or more sheet metal pieces that are stamped and formed, and may be coupled together using fasteners or other connecting means. The sheet metal may be sufficiently thin to allow the frame 200 to have some flexibility for moving, twisting or otherwise manipulating the trays 114 into position relative to the backplane 120 (shown in FIG. 3) to position the cable connectors 116 in the openings 126 (shown in FIG. 3) in the backplane 120.

In an exemplary embodiment, the tray 114 includes a line card section 210 and a switch card section 212. The cable connectors 116 arranged in the line card section 210 extend through the front opening 406 for mating with the card connectors 132 associated with the line card 102 (both shown in FIG. 1). The cable connectors 116 arranged in the switch card section 212 extend through the opening 404 for mating with the card connectors 134 associated with the switch card 104 (both shown in FIG. 1). The tray 114 may have different sections in alternative embodiments.

The frame 200 may have a different shape in the line card section 210 as compared to the switch card section 212. For example, in the illustrated embodiment shown in FIG. 6, the frame 200 in the line card section 210 may be wider than the frame 200 in the switch card section 212, such as to accommodate different sized cable connectors 116.

The tray 114 includes a plurality of spacers 218 and 220 in the front openings 404 and 406, respectively, used to hold positions of the cable connectors 116. The spacers 218 and 220 are coupled to the tray 114 proximate to the front edge 204. The spacers 218 in the line card section 210 may be different than the spacers 220 in the switch card section 212. For example, in the illustrated embodiment, the spacers 218 are larger than the spacers 220. The spacers 218 and 220 support one or more cable connectors 116 within the frame 200. The spacers 218 and 220 align and position the cable connectors 116 with respect to the backplane 120. The spacers 218 hold the cable connectors 116 in position relative to the backplane 120. Optionally, the spacers 218 and 220 may be coupled to the side walls 202 using float mechanisms, such as fasteners, that allow the spacers 218 and 220 to move or float relative to the frame 200. In an exemplary embodiment, the spacers 218 and 220 are configured to abut against the backplane 120 at the mounting locations of the backplane 120 to precisely position the cable connectors 116 relative to the openings 126.

With reference back to FIG. 3, when the trays 114 are arranged in the chassis 110, adjacent trays 114 are inverted such that one tray 114 is arranged with the line card section 210 along the top of the cable rack 112 and with the adjacent tray arranged with the line card section 210 along the bottom of the cable rack 112. The switch card sections 212 of the pair of trays 114 are aligned along the center section of the cable rack 112. Such an arrangement allows for tight packing of the trays 114 in the chassis 110 even though the line card section 210 and switch card section 212 have different widths. Other configurations are possible in alternative embodiments. Any of the trays 114 may be easily accessed from the rear of the cable rack 112 to allow for ease of insertion and removal of any particular tray 114 without needing to disassemble the cable rack 112.

In an exemplary embodiment, the trays 114 are electromagnetically shielded to allow the trays 114 to be inserted or removed without removing power to the cable rack 112 and/or other trays 114 in the cable rack 112. Thus, an individual tray 114 may be hot swapped.

Returning to FIG. 6, during operation of the backplane system 100, the cable connectors 116 (shown in FIG. 1) emit electromagnetic radiation (EMR) that radiates from components such as, for example, the signal contacts 186 and/or the cables 150 (shown in FIG. 4). A portion of the EMR propagates outward, such as in the directions of lateral axis 398 and longitudinal axis 400. The EMR may propagate down the cavity 201. The EMR may cause electromagnetic interference (EMI) which detrimentally interferes with signals carried in the cable backplane system 100, thus reducing the performance of the cable backplane system 100. The walls of the tray 114, being metal, serve to reduce most EMI by containing the EMR within the tray 114 and/or absorbing the EMR. However, there are portions of the tray 114 that are susceptible to leakage EMR. For example, EMR may exit at the front edge 204, through the front openings 404 and 406. As another example, EMR may exit through the top opening 408 and/or the bottom opening 410. Additionally, EMR may be emitted from an external source (e.g., one or more other trays in the cable rack 112 and/or other equipment) and then enter the tray 114 through the openings 404-410. In an exemplary embodiment, the tray 114 includes EMR absorbers 412, 414, 416, and 418 extending along one or more openings in the tray 114 to suppress the propagation of EMR into or out of the tray 114 in order to at least partially reduce or eliminate EMI. The EMR absorbers 412, 414, 416, and 418 may extend along the side walls of the tray and may be positioned proximate to the openings 404-410.

In the illustrated embodiment, the EMR absorber 412 is positioned at or near the bottom opening 410, and may be referred to herein as a bottom EMR absorber 412. The EMR absorbers 414, 416 are positioned at or near the front openings 404, 406 and are referred to herein as front EMR absorbers 414, 416. The EMR absorber 418 is positioned at or near the top opening 408 and is referred to herein as a top EMR absorber 418. The EMR absorbers 412-418 are manufactured from an electromagnetic energy absorbent material. Optionally, the EMR absorbers 412-418 may be manufactured from the same material but may be manufactured from different materials in alternate embodiments. The EMR absorbers 412-418 may be manufactured from a material having a high relative permeability to absorb EMR and effectively increase the impedance of the raceway to EMR, reflecting some electromagnetic energy upon entry of the electromagnetic energy into the raceway and/or absorbing the electromagnetic energy that penetrates the raceway. The EMR absorbers 412-418 may reduce electromagnetic energy reflections off of the side walls 202 and the back wall 208. The efficiency of the EMR absorbers 412-418 may depend on the formulation and application (thickness, relative permeability, size, location, and the like) of the EMR absorbers 412-418. Optionally, or alternatively, the EMR absorbers 412-418 may be grounded. The EMR absorbers 412-418 may include grounding wires (not shown) to electrically connect the EMR absorbers 412-418 to a grounded reference location, as is discussed below. In other embodiments, the EMR absorbers 412-418 may also be configured to absorb acoustic noise and/or vibrations in addition to EMR.

In an exemplary embodiment, the EMR absorbers 412-418 comprise thin, magnetically loaded elastomeric sheets. The EMR absorbers 412-418 may be manufactured from various materials, such as rubber, nitrile, silicon, Viton®, neoprene, Hypolan®, urethane, or other elastomeric materials. The EMR absorbers 412-418 may have magnetic fillers included within the elastomeric material, such as a carbonyl iron powder, an iron silicide, or other magnetic fillers. The type of material within the EMR absorbers 412-418 may be selected to target EMR at different frequencies. Optionally, the EMR absorbers 412-418 may be manufactured from a compressible material. The EMR absorbers 412-418 may then be at least partially compressed against the side walls 202 to conform to the contour of the side walls 202, thus providing a seal between the side walls 202 and the corresponding openings 404, 406, 408 and 410.

The thicknesses of the EMR absorbers 412-418 may be selected to control the amount of EMI reduction. For example, different thicknesses of the EMR absorbers 412-418 may be used to target energy at different frequencies. Additionally, the front EMR absorbers 414, 416 may be sized to avoid fouling the mating of the card connectors 132, 134 with the cable connector 116. For example, the front EMR absorbers 414, 416 may be sized to facilitate proper coupling of the tray 114 to the backplane 120. The bottom EMR absorber 412 and the top EMR absorber 418 may have a different thickness than the front EMR absorbers 414, 416.

The EMR absorbers 412-418 are selectively positioned on and/or within the tray 114 to control the amount of EMI reduction. The EMR absorbers 412-418 may extend along the direction of the propagation of electromagnetic radiation to define surface wave absorbers.

The bottom EMR absorber 412 extends along the side walls 202 of the tray 114 and is positioned proximate to the bottom opening 410. The bottom EMR absorber 412 is oriented generally parallel to the longitudinal axis 400. The bottom EMR absorber 412 abuts against the back wall 208 of the tray 114 and extends to the front edge 204. The bottom EMR absorber 412 extends between interior faces of the side walls 202. In the illustrated embodiment, the bottom EMR absorber 412 extends along the bottom opening 410 and substantially or entirely fills the area defining the bottom opening 410.

The top EMR absorber 418 extends along the side walls 202 of the tray 114 and is positioned proximate to the top opening 408. The top EMR absorber 418 abuts against the back wall 208 of the tray 114 and extends to the front edge 204 along the longitudinal axis 400. The top EMR absorber 418 extends between the interior faces of the side walls 202. In the illustrated embodiment, the top EMR absorber 418 extends along the top opening 408 and substantially or entirely fills the area of the top opening 408.

In certain embodiments, the bottom EMR absorber 412 and/or the top EMR absorber 418 are blocks having a generally rectangular shape. Other shapes are possible in alternative embodiments.

The front EMR absorbers 414, 416 are positioned along the front edge 204. The front EMR absorbers 414, 416 may be positioned forward of the front edge 204 to suppress EMR through the front openings 404, 406. Optionally, front EMR absorbers 414, 416 may be coupled to the spacers 218, 220, respectively.

The front EMR absorbers 414, 416 generally surround the mating interfaces of the line card section 210 and the switch card section 212, respectively. In an exemplary embodiment, the front EMR absorbers 414, 416 include mating ends 415, 417 configured to be mated with corresponding mating areas along the cross bars 140 (shown in FIG. 3) surrounding the openings 126 in the backplane 120. Optionally, the front EMR absorbers 414, 416 may be compressed when mated with the mating areas on the backplane 120. Compression of the EMR absorbers 414, 416 may provide a seal to suppress EMR from entering into, or traveling out of the tray 114. Optionally, the backplane 120 may include conductive pads (not shown) along the mating areas and the front EMR absorbers 414, 416 may be electrically grounded to the conductive pads. In alternate embodiments, the front EMR absorbers 414, 416 may extend through the openings 126 and may abut against the line and switch cards 102, 104.

In an exemplary embodiment, the front EMR absorber 414 comprises a band surrounding the perimeter of the front opening 404. The front EMR absorber 414 is a continuous, integrally formed frame that surrounds the spacers 220 and/or the cable connectors 116 at the front edge 204.

In an exemplary embodiment, the front EMR absorber 416 comprises a band surrounding the perimeter of the front opening 406. The front EMR absorber 416 is a continuous, integrally formed frame that surrounds the spacers 218 and/or the cable connectors 116 at the front edge 204.

The front EMR absorbers 414, 416 may be coupled to the spacers 218, 220. The front EMR absorbers 414, 416 may include an adhesive backing that allows the front EMR absorbers 414, 416 to be applied to the outer surface of the spacers 218, 220. Alternative securing means may be used in addition to, or as an alternative to, the adhesive backing, such as, for example a threaded fastener, a bracket, an adhesive, and/or the like. For example, the EMR absorbers 414, 416 may be screwed onto one or more surfaces of one or more spacers 218, 220.

Figure 7:
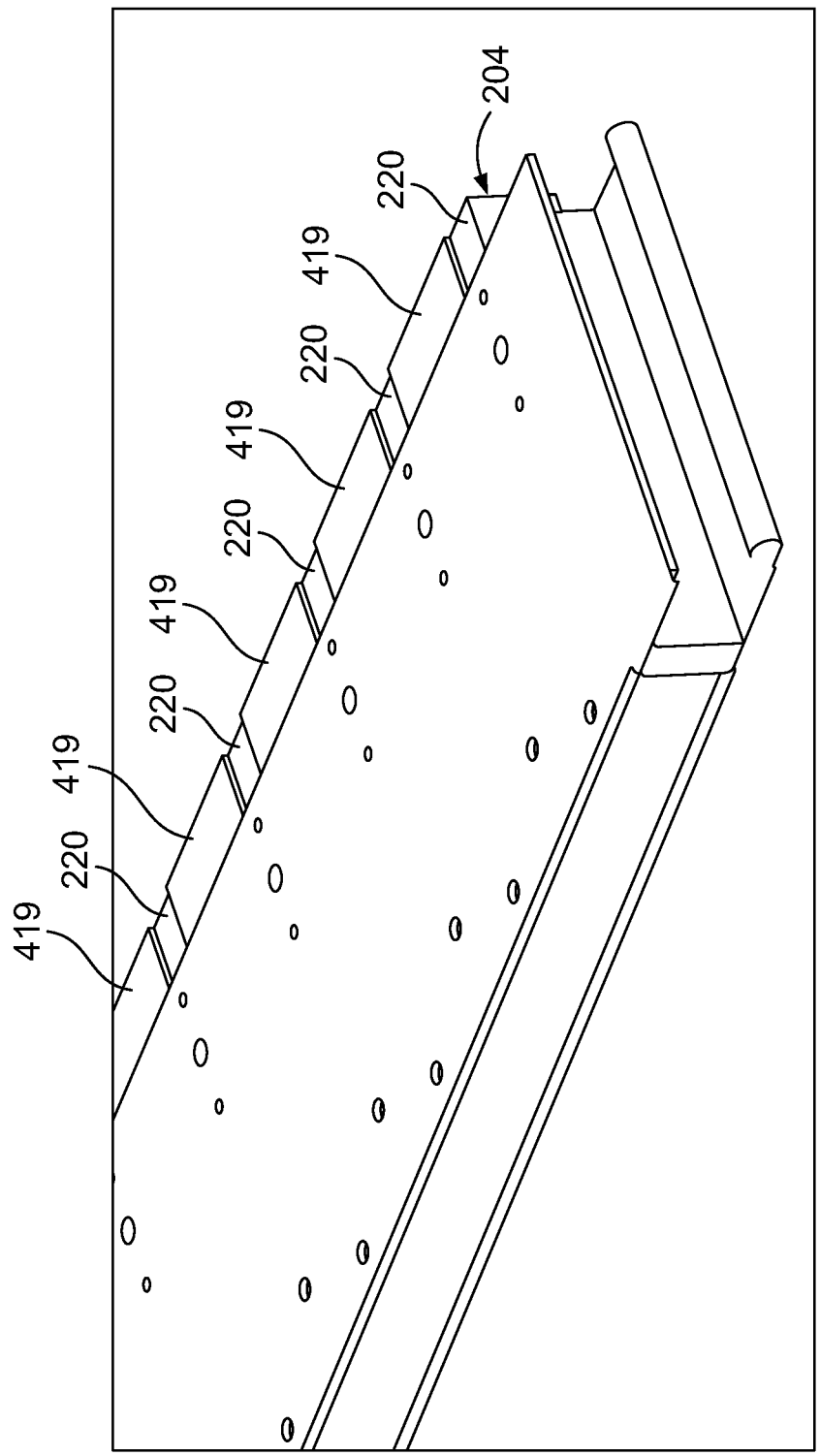
FIG. 7 is a partial side perspective view of the tray shown in FIG. 6.

Optionally, as shown in the illustrated embodiment in FIG. 7, a plurality of discrete front EMR absorbers 419 extend along the front edge 204 between corresponding spacers 220. The discrete front EMR absorbers 419 are sheets that cover corresponding cable connectors 116 (shown in FIG. 3). Optionally, the discrete front EMR absorbers 419 may comprise bands surrounding the perimeter of openings formed by adjacent spacers 220 at the front edge 204.

With reference to FIG. 6, in an exemplary embodiment, the front EMR absorbers 414, 416 are contiguous segments having parallel sheets and straps that form bands surrounding the perimeter of the front openings 404, 406. For example, the front EMR absorber 414 includes a first sheet 420 that extends along the lateral axis 398 on the front edge 204 and a second sheet 422 parallel to the first sheet 420 along an opposite side of the front edge 204. The first sheet 420 and the second sheet 422 form a gap therebetween in which the cable connectors 116 extend through. A top strap 424 extends along a top edge of a top-most spacer 428 in the opening 404. A bottom strap 426 extends along a bottom edge of a bottom-most spacer 430 in the opening 404. The straps 424, 426 connect the first sheet 420 and the second sheet 422. Optionally, the straps 424, 426 may be integral with the sheets 420, 422. Alternatively, the straps 424, 426 may be separate, discrete pieces that are coupled to the sheets 420, 424. For example, the straps 424, 426 may be held between the first sheet 420 and the second sheet 422 by a friction fit. Alternatively, the straps 424, 426 may use additional securing means to connect the first sheet 420 to the second sheet 422 (e.g., a threaded fastener and/or an adhesive).

The front EMR absorber 416 includes a first sheet 432 that extends along the lateral axis 398 on the front edge 204 and a second sheet 434 parallel to the first sheet 432 along an opposite side of the front edge 204. The first sheet 432 and the second sheet 434 form a gap therebetween in which the cable connectors 116 extend through. A top strap 436 extends along a top edge of the top-most spacer 440 of the opening 406. A bottom strap 438 extends along a bottom edge that is an end opposite to the top edge of the bottom-most spacer 442 of the opening 406. The straps 436, 438 connect the first sheet 432 and the second sheet 434. Optionally, the straps 436, 438 may be integral with the sheets 432, 434. Alternatively, the straps 436, 438 may be separate, discrete pieces that are coupled to the sheets 432, 434. For example, the straps 436, 438 may be held between the first sheet 432 and the second sheet 434 by a friction fit. Alternatively, the straps 436, 438 may use additional securing means to connect the first sheet 432 to the second sheet 434 (e.g., a threaded fastener and/or an adhesive).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
a tray having a frame with side walls surrounding a cavity defining a raceway, the side walls extending to a front edge of the frame;
spacers coupled to the tray proximate to the front edge;
cable connectors having a plurality of cables extending therefrom and routed in the raceway, the cable connectors being held in position relative to a backplane by the spacers; and
an electromagnetic radiation (EMR) absorber extending along an opening in the tray to suppress the propagation of EMR into or out of the tray.

2. The cable backplane system of claim 1, wherein the tray includes a bottom, the opening provided along the bottom of the tray, the EMR absorber extending along the side walls of the tray and being positioned proximate to the opening at the bottom.

3. The cable backplane system of claim 1, wherein the tray includes a top, the opening provided along the top of the tray, the EMR absorber extending along the side walls of the tray and being positioned proximate to the opening at the top.

4. The cable backplane system of claim 1, wherein the EMR absorber is positioned along the front edge and is coupled to the spacers.

5. The cable backplane system of claim 1, wherein the EMR absorber comprises a band surrounding the spacers and the cable connectors at the front edge.

6. The cable backplane system of claim 1, wherein the tray includes a front opening defined between the side walls at the front edge, the EMR absorber being positioned forward of the front edge to suppress EMR through the front opening.

7. A cable backplane system comprising:
a backplane having a plurality of backplane openings therethrough, the backplane having mounting areas surrounding corresponding openings; and
a cable rack coupled to a rear of the backplane, the cable rack comprising:
a tray having a frame with side walls surrounding a cavity defining a raceway, the side walls extending to a front edge of the frame;
spacers coupled to the tray proximate to the front edge;
cable connectors having cables extending therefrom and routed in the raceway, the cable connectors being received in corresponding backplane openings and held in position relative to the backplane by the spacers; and
an electromagnetic radiation (EMR) absorber extending along the front edge of the frame, the EMR absorber engaging corresponding mounting areas of the backplane, the EMR absorber suppressing the propagation of EMR into or out of the tray.

8. The cable backplane system of claim 7, wherein the EMR absorber constitutes a surface wave absorber generally parallel to a direction of the propagation of EMR through the tray.

9. The cable backplane system of claim 7, wherein the EMR absorber is fabricated from an elastomeric material.

10. The cable backplane system of claim 7, wherein the EMR absorber is coupled to the spacers.

11. The cable backplane system of claim 7, wherein the EMR absorber comprises a band surrounding the spacers and cable connectors.

12. The cable backplane system of claim 7, wherein the backplane comprises conductive pads along corresponding mounting areas, the EMR absorbers being electrically connected to the corresponding conductive pads.

13. The cable backplane system of claim 7, wherein the EMR absorber is compressed between the tray and the backplane.

14. The cable backplane system of claim 7, wherein the EMR absorber includes a first sheet and a second sheet parallel to and spaced apart from the first sheet to form a gap therebetween, the cable connectors being positioned in the gap between the first and second sheets.

15. The cable backplane system of claim 14, further comprising straps connecting the first and second sheets at opposite ends of the first and second sheets.

16. The cable backplane system of claim 7, wherein the cable connectors include mating ends configured to be mated with corresponding card connectors, the EMR absorber surrounding the mating end of the card connectors.

17. A cable backplane system comprising:
a tray having a frame with side walls surrounding a cavity defining a raceway, the side walls extending to a front edge of the frame;
the tray includes a bottom having an opening provided along the bottom of the tray,
the tray includes a top having an opening provided along the top of the tray,
spacers coupled to the tray proximate to the front edge;
cable connectors having a plurality of cables extending therefrom and routed in the raceway, the cable connectors being held in position relative to a backplane by the spacers; and
electromagnetic radiation (EMR) absorbers extending along at least one of the top opening and the bottom opening in the tray to suppress the propagation of EMR into or out of the tray.

18. The cable backplane systems of claim 17, wherein the one or more EMR absorbers comprise blocks received in the cavity between the side walls of the tray.

19. The cable backplane system of claim 17, wherein the one or more EMR absorbers comprise surface wave absorbers.

20. The cable backplane system of claim 17, wherein the one or more EMR absorbers are compressed between the side walls of the tray.

* * * * *